United States Patent
Li

(12) United States Patent (10) Patent No.: US 7,845,903 B2
Li (45) Date of Patent: Dec. 7, 2010

(54) FAN HOLDER FOR RECEIVING MULTIPLE FANS

(75) Inventor: Zhan-Yang Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 784 days.

(21) Appl. No.: 11/838,246

(22) Filed: Aug. 14, 2007

(65) Prior Publication Data

US 2009/0009961 A1 Jan. 8, 2009

(30) Foreign Application Priority Data

Jul. 6, 2007 (CN) .................. 2007 2 0200629 U

(51) Int. Cl.
*F04D 29/60* (2006.01)
(52) U.S. Cl. .................. 415/186; 415/189; 415/213.1; 415/214.1; 416/244 R; 416/247 R
(58) Field of Classification Search .............. 415/186, 415/189, 213.1, 214.1; 416/244 R, 247 R; 361/695
See application file for complete search history.

(56) References Cited

U.S. PATENT DOCUMENTS

| 6,031,719 | A  | * | 2/2000  | Schmitt et al. | ........... 415/213.1 |
| 6,236,564 | B1 | * | 5/2001  | Fan | ........................ 415/213.1 |
| 6,556,437 | B1 | * | 4/2003  | Hardin | .................... 415/213.1 |
| 6,808,411 | B2 |   | 10/2004 | Chen | |
| 6,826,048 | B1 | * | 11/2004 | Dean et al. | ............... 415/213.1 |
| 2004/0256334 | A1 |   | 12/2004 | Chen | |
| 2007/0053159 | A1 | * | 3/2007  | Crippen et al. | .............. 361/695 |

* cited by examiner

*Primary Examiner*—Igor Kershteyn
(74) *Attorney, Agent, or Firm*—Frank R. Niranjan

(57) ABSTRACT

A fan holder is used for dissipating heat from electronic devices. The fan holder includes a fan bracket and an expansion bracket. The fan bracket has a first plate and a second plate. A plurality of partitions is configured between the first plate and the second plate, for connecting the first plate with the second plate. Thereby four same-size receiving rooms are formed in the fan bracket. These receiving rooms are used to receive fans. A plurality of insert slots is defined in four corners of the receiving rooms adjacent to the fixing member. The expansion bracket includes a front plate and a pair of side plates extending perpendicularly from two opposite sides of the front plate. A plurality of hooks is formed on corners of the backside of the side plates, inserting into the insert slots to mount the expansion bracket on the fan bracket.

10 Claims, 4 Drawing Sheets

FAN HOLDER FOR RECEIVING MULTIPLE FANS

BACKGROUND

1. Field of the Invention

The present invention relates to a fan holder, and more particularly to a fan holder for mounting a plurality of fans in a computer or a server.

2. Description of Related Art

In the computer industry, different kinds of servers are developed to satisfy different kinds of demands. For example, network servers provide network service, storage servers are used to store a mass of data, operation servers possess quick operation function, and so on. Thus, a plurality of hard disks is installed in the storage servers, and a plurality of central processing units is secured on motherboards in the operation servers, which generate a large amount of heat in the servers. For dissipating heat in each server, a fan bracket with a plurality of fans mounted therein is installed in the server to cool the server.

Though the fans in the fan bracket meet heat dissipating needs of many servers, it is not enough for special servers having higher heat dissipating needs. Often, a new fan bracket will then be added with just enough fans to meet the current need, which generally leaves the fan bracket not fully utilized as its capacity is greater than the need, which wastes space in the server.

What is needed, therefore, is to provide a simply structured, expandable fan holder to save space in a server.

SUMMARY

A fan holder is used for dissipating heat from electronic devices. The fan holder includes a fan bracket and an expansion bracket. The fan bracket has a first plate and a second plate. A plurality of partitions is configured between the first plate and the second plate, for connecting the first plate with the second plate. Thereby four same-size receiving rooms are formed in the fan bracket. These receiving rooms are used to receive fans. A plurality of insert slots is respectively defined in four corners of the receiving rooms adjacent to the fixing member. The expansion bracket includes a front plate and a pair of side plates extending perpendicularly from two opposite sides of the front plate. A plurality of hooks is formed on corners of the backside of the side plates, corresponding to and insertable into the insert slots to mount the expansion bracket on the fan bracket.

Other advantages and novel features of the present invention will become more apparent from the following detailed description of an embodiment when taken in conjunction with the accompanying drawings, in which:

DETAILED DESCRIPTION

Figure 1:
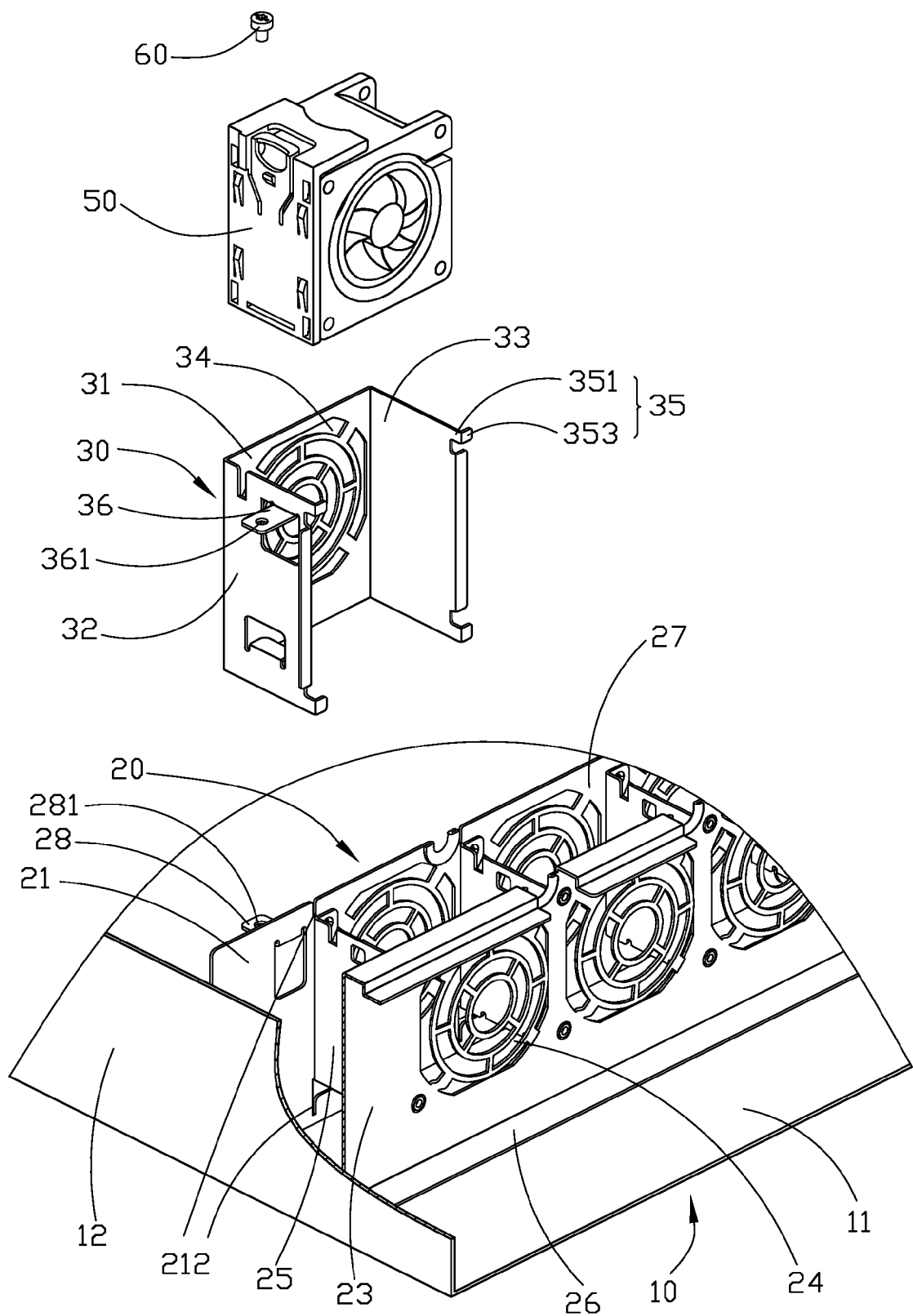
FIG. 1 is an exploded view of a fan holder according to an embodiment of the present invention, the fan holder is secured within a chassis which is partially shown.
Figure 2:
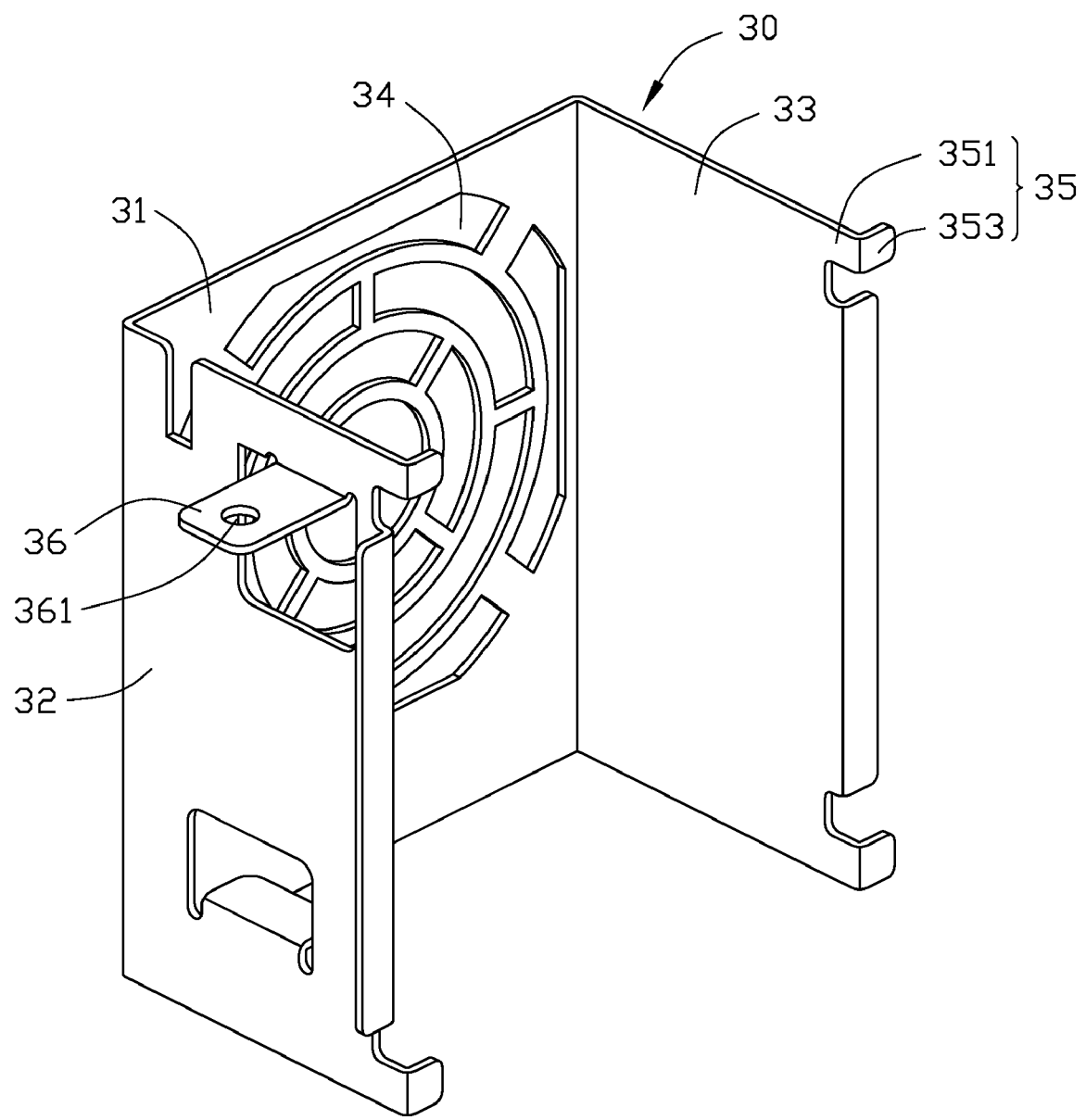
FIG. 2 is an expansion bracket view of the fan holder of FIG. 1.

Referring to FIGS. 1 and 2, a fan holder of an embodiment of the present invention is placed within a chassis 10 of a server for dissipating heat from the chassis 10. The fan holder includes a fan bracket 20 and an expansion bracket 30.

The chassis 10 includes a bottom wall 11 and a pair of parallel side walls 12, 13 extending upwardly and perpendicularly from opposite edges of the bottom wall 11. The fan bracket 20 has a first plate 21 and a second plate 23. The first plate 21 and the second plate 23 are parallel to each other. Two flanges 26 extend outward from bottom edges of the first plate 21 and the second plate 23 respectively, contacting the bottom wall 11 of the chassis 10. A plurality of partitions 25 is configured between the first plate 21 and the second plate 23, for connecting the first plate 21 with the second plate 23. The first and second plates 21, 23 and the partitions 25 cooperatively define four same-size receiving rooms 27 in the fan bracket 20. The receiving rooms 27 are used to receive fans therein. The first plate 21 and the second plate 23 define a plurality of airflow openings 24 in communication with the respective receiving rooms 27. Part of the first plate 21 is punched perpendicularly outward to form a fixing member 28 adjacent to a receiving room 27. A fixing hole 281 is defined in the fixing member 28. Four insert slots 212 are defined in the first plate 21 at four corners of each of the receiving rooms 27 respectively, which are adjacent to the fixing member 28. Opposite ends of the first plate 21 and the second plate 23 are fixed on the sidewalls 12, 13 of the chassis 10, and thereby the fan bracket 20 is installed in the chassis 10.

The expansion bracket 30 is used to secure a fan 50 in the chassis 10 if and when needed to augment heat dissipation in the server. The expansion bracket 30 includes a front plate 31 and a pair of side plates 32, 33 extending perpendicularly from two opposite sides of the front plate 31. The front plate 31 defines a plurality of airflow openings 34 therein. A fixing piece 36 is suspended outward from the side plate 32, corresponding to the fixing member 28 of the fan bracket 20. A fixing hole 361 is defined in the fixing piece 36 corresponding to the fixing hole 281 of the fixing member 28. A plurality of hooks 35 is formed on corners of the backside of the side plates 32, 33 corresponding to the insert slots 212 of the fan bracket 20. The hooks 35 are L-shaped. Each hook 35 includes an inserting portion 351 and an engaging portion 353 extending perpendicularly from an end of the inserting portion 351.

In the FIGS. 1 and 2, only one fan 50 is depicted to be installed in a receiving room 27 of the fan bracket 20 which is adjacent to the side wall 13 for clearly showing details of the invention. In practice, all the receiving rooms 27 of the fan bracket 20 may receive fans 50 therein. When the chassis 10 has greater heat dissipating needs, the expansion bracket 30 with a fan 50 is secured on the fan bracket 20.

Figure 3:
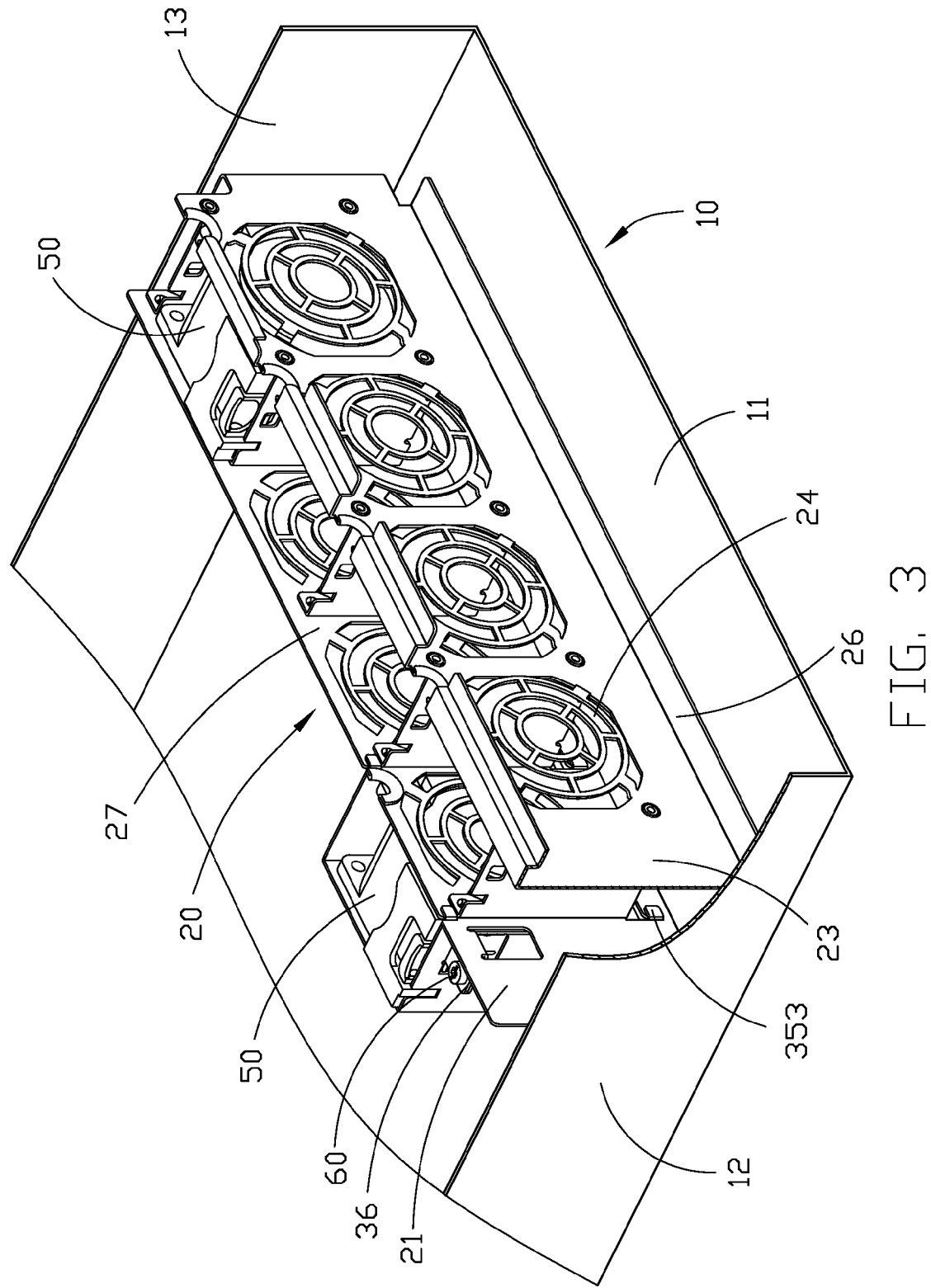
FIG. 3 is an assembled view of FIG. 1.
Figure 4:
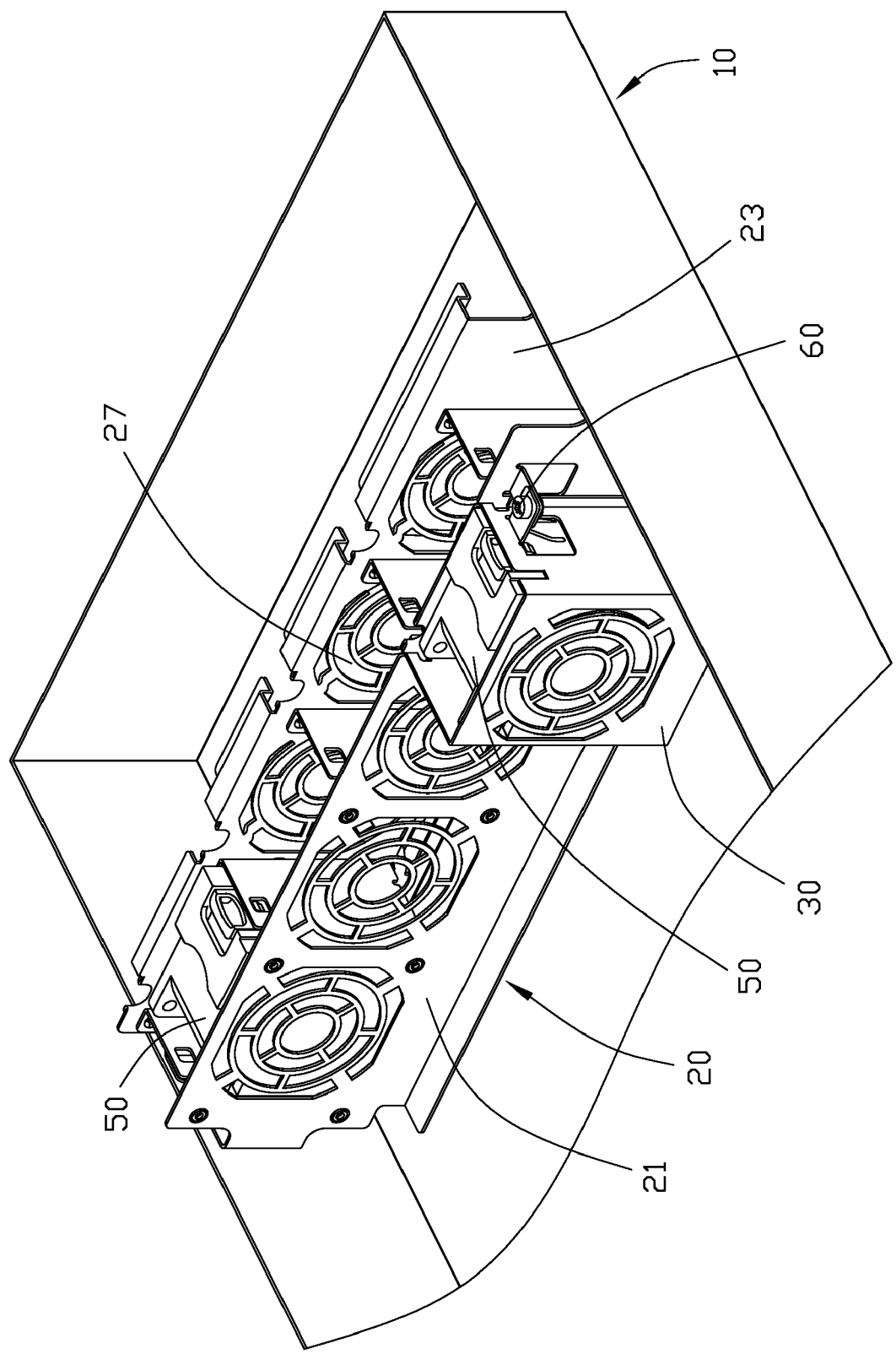
FIG. 4 is similar to FIG. 3, but viewed from another aspect.

Referring also to FIGS. 3 and 4, the back side of the expansion bracket 30 is aligned with the receiving room 27 which is adjacent to the fixing member 28. The inserting portions 351 of the hooks 35 of the expansion bracket 30 insert into the corresponding insert slots 212 of the fan bracket 20. The engaging portions 353 of the hooks 35 engage in an inner side of the first plate 21 of the fan bracket 20. At the same time, the fixing hole 361 of the fixing piece 36 is aligned with the fixing hole 281 of the fixing member 28, and a screw 60 is installed in the fixing hole 281 and the fixing hole 361. Thereby, the expansion bracket 30 is secured on the fan bracket 30. The airflow openings 34, an opening defined in the backside of the expansion bracket 30, and the corresponding airflow openings 24 of the receiving room 27 are aligned in a straight line. A fan 50 in the expansion bracket 30 and a fan (not shown) in the corresponding receiving room 27 are located on a same airflow path so as to dissipate heat for the chassis 10 better.

In other preferred embodiments of the present invention, the installation position of the expansion bracket 30 can be varied according to the position of heating components in the chassis 10. When a plurality of fans 50 are needed, the corresponding expansion brackets 30 with the fans 50 are installed in the chassis 10 by the above way.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan holder for installing a plurality of fans, the fan holder comprising:
    a chassis;
    a fan bracket installed in the chassis; and
    an expansion bracket secured on the fan bracket, for receiving an additional fan;
    wherein the fan bracket comprises a plurality of receiving rooms for receiving the fans, and the expansion bracket is aligned with one of the receiving rooms;
    the fan bracket has a plurality of airflow openings at opposite sides of each of the receiving rooms, and the expansion bracket has a plurality of airflow openings defined therein, the airflow openings of the expansion bracket being aligned with the corresponding airflow openings of the receiving room;
    the fan bracket includes a first plate, a second plate parallel to the first plate, and a plurality of partitions interconnected between the first plate and the second plate, the first and second plates and the partitions cooperatively forming the receiving rooms, the airflow openings being defined in the first plate and the second plate at the opposite sides of the receiving rooms;
    the expansion bracket includes a front plate, the front plate defines a plurality of airflow openings therein,
    the expansion bracket includes two side plates extending perpendicularly from opposite sides of the front plate of the expansion bracket, at least one hook is formed on the side plates, and the first plate of the fan bracket defines at least one insert slot with the at least one hook engaged therein.

2. The fan holder as described in claim 1, wherein the hook includes an inserting portion inserting into the corresponding insert slot, and an engaging portion engaging on an inner side of the first plate.

3. The fan holder as described in claim 1, wherein the expansion bracket defines a fixing hole therein, and the first plate defines a fixing hole corresponding to the fixing hole of the expansion bracket, a fastener extending through the fixing holes of the expansion bracket and the first plate thereby securing the expansion bracket to the first plate.

4. A fan holder for installing a plurality of fans, the fan holder comprising:
    a chassis;
    a fan bracket installed in the chassis; and
    an expansion bracket comprising at least one hook engaging with the fan bracket, for receiving an additional fan;
    wherein the fan bracket defines a plurality of receiving rooms for receiving the fans, and the expansion bracket is aligned with one of the receiving rooms;
    the fan bracket has a plurality of airflow openings at opposite sides of each of the receiving rooms, and the expansion bracket has a plurality of airflow openings defined therein, the airflow openings of the expansion bracket being aligned with the corresponding airflow openings of the receiving room;
    the fan bracket includes a first plate, a second plate parallel to the first plate, and a plurality of partitions interconnected between the first plate and the second plate, the first and second plates and the partitions cooperatively forming the receiving rooms, the airflow openings being defined in the first plate and the second plate at the opposite sides of the receiving rooms;
    the expansion bracket defines a fixing hole therein, and the first plate defines a fixing hole corresponding to the fixing hole of the expansion bracket, a fastener extending through the fixing holes of the expansion bracket and the first plate thereby securing the expansion bracket to the first plate.

5. The fan holder as described in claim 4, wherein the expansion bracket includes a front plate, the front plate defines a plurality of airflow openings therein.

6. The fan holder as described in claim 5, wherein the expansion bracket includes two side plates extending perpendicularly from opposite sides of the front plate of the expansion bracket, at least one hook is formed on the backside of the side plates, and the first plate of the fan bracket defines at least one insert slot with the at least one hook engaged therein.

7. The fan holder as described in claim 6, wherein the hook includes an inserting portion inserting the corresponding insert slot, and an engaging portion engaging on the inner side of the first plate.

8. An apparatus comprising:
    a housing for receiving a heat generating device therein, the housing including a bottom plate;
    a first plate extending from the bottom plate, the first plate having a plurality of first openings;
    a second plate extending from the bottom plate, the second plate having a plurality of second openings aligned with the respective first openings;
    a plurality of partition walls interconnected between the first plate and the second plate, the first plate, the second plate and the partition walls cooperatively forming a plurality of receiving rooms, the receiving rooms being aligned with each other in a first direction, the first and second openings being located at opposite sides of the receiving rooms;
    a plurality of fans received in the receiving rooms;
    an expansion bracket secured on the first plate, the expansion bracket and the first plate cooperatively forming an additional receiving room, the additional receiving room being aligned with one of the receiving room in a second direction perpendicular to the first direction, and an additional fan received in the additional receiving room;
    wherein the expansion bracket has U-shaped cross section, and the expansion bracket is detachably engaged with the first plate.

9. The apparatus of claim 8, wherein the expansion bracket comprises two side plates substantially perpendicular to the first plate, at least one hook is located on the side plates, and at least one insert slot defined in the first plate of the fan bracket with the at least one hook engaged therein.

10. The apparatus of claim 9, wherein the at least one hook comprises an inserting portion, extending through the at least one insert slot, and an engaging portion, abutting against the inner side of the first plate.

* * * * *